(12) United States Patent
Powers, Jr. et al.

(10) Patent No.: US 11,372,046 B2
(45) Date of Patent: Jun. 28, 2022

(54) IDENTIFICATION AND MAPPING OF FUEL CELL CATHODE VALVE ICE BREAKING STALL TORQUE CAPABILITY

(71) Applicant: GM GLOBAL TECHNOLOGY OPERATIONS LLC, Detroit, MI (US)

(72) Inventors: William A. Powers, Jr., Royal Oak, MI (US); Rajeev Vyas, Rochester Hills, MI (US); Stephen G. Poulos, Farmington Hills, MI (US); Ashish V. Gadre, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 469 days.

(21) Appl. No.: 16/566,128

(22) Filed: Sep. 10, 2019

(65) Prior Publication Data

US 2021/0072316 A1     Mar. 11, 2021

(51) Int. Cl.
*G01R 31/34*      (2020.01)
*H01M 8/0432*   (2016.01)

(52) U.S. Cl.
CPC ........ *G01R 31/34* (2013.01); *H01M 8/04335* (2013.01); *H01M 2250/00* (2013.01)

(58) Field of Classification Search
CPC .............. G01R 31/34; H01M 8/04335; H01M 2250/00
See application file for complete search history.

(56) References Cited

U.S. PATENT DOCUMENTS

| 2008/0173101 | A1* | 7/2008 | Sowle | G01M 17/007 73/862.09 |
|---|---|---|---|---|
| 2011/0308295 | A1* | 12/2011 | Yamamoto | G01L 25/003 73/1.09 |
| 2021/0063493 | A1* | 3/2021 | Dubois | H01M 8/04388 |
| 2021/0072316 | A1* | 3/2021 | Powers, Jr. | H01M 8/04201 |
| 2021/0399612 | A1* | 12/2021 | Vendt | H02K 11/20 |
| 2022/0037063 | A1* | 2/2022 | Kondo | H01C 1/084 |

* cited by examiner

*Primary Examiner* — Eric S. McCall
(74) *Attorney, Agent, or Firm* — Quinn IP Law (57) ABSTRACT

A method for identifying and mapping a maximum instantaneous stall torque capability of a fuel cell cathode valve includes: maintaining a temperature of an electric motor at a predetermined temperature, wherein the predetermined temperature is equal to or less than a freezing point of water (0° C.), and the electric motor includes motor brushes, commutator poles, a stator, a rotor rotatable with respect to the stator, and a shaft coupled to the rotor; locking the shaft of the electric motor such that the shaft is incapable of rotating, thereby fixing the shaft at a locked position; mounting the shaft of the electric motor to a dynamometer; supplying electrical energy to the electric motor; monitoring an instantaneous stall torque of the electric motor; and monitoring a rotor electrical resistance.

19 Claims, 8 Drawing Sheets

| Stall Torque at -30° C | | | | | | | | | |
|---|---|---|---|---|---|---|---|---|---|
| | Minimum Series | | | Maximum Series | | | Average Series | | |
| | Min | Max | Delta | Min | Max | Delta | Min | Max | Delta |
| Motor 1 | -15.6 | 8.2 | 24 | 248 | 283 | 35 | 240 | 283 | 43 |
| Motor 2 | -2.5 | 0.5 | 3 | 262 | 291 | 29 | 262 | 290 | 28 |
| Motor 3 | -5.8 | 2.1 | 8 | 267 | 296 | 27 | 271 | 294 | 23 |

FIG. 13

| Stall Resistance ($\Omega$) at -30°C | | | |
|---|---|---|---|
| | Minimum Series | | |
| | Min | Max | Delta |
| Motor 1 | 1.1 | 1.3 | 0.2 |
| Motor 2 | 1.1 | 1.3 | 0.2 |
| Motor 3 | 1.1 | 1.3 | 0.23 |

IDENTIFICATION AND MAPPING OF FUEL CELL CATHODE VALVE ICE BREAKING STALL TORQUE CAPABILITY

INTRODUCTION

The present disclosure relates to identification and mapping of fuel cell cathode valve ice breaking stall toque capability.

Under freezing temperature conditions, condensation and humidity facilitates ice formation on a closed valve blade and bore of a fuel cell cathode valve of a fuel cell, leading to a fuel cell cathode valve locked condition. When a vehicle is in the key-off state, the fuel cell cathode valve is in the closed state. While the vehicle transitions from the key-off state to the key-on state, the fuel cell cathode valve is supposed to transition from the closed state to the open state. In order to successfully start the fuel cell vehicle, a minimum fuel cell cathode valve stall toque is required to guarantee ice breaking at the valve blade.

SUMMARY

The present disclosure relates to identification and mapping of fuel cell fuel cell cathode valve ice breaking stall toque capability. By employing this method, the minimum torque required to consistently break ice at the fuel cell cathode valve may be identified. As such, the fuel cell cathode valve may be controlled using this identified minimum torque to consistently break ice formed on the fuel cell cathode valve, thereby avoid a non-start condition in a fuel cell vehicle when the vehicle transitions from the key-off state to the key-on state.

In an aspect of the present disclosure, a method is used for identifying and mapping a maximum instantaneous stall torque capability of a fuel cell cathode valve. The method may include the following steps: maintaining a temperature of an electric motor at a predetermined temperature, wherein the predetermined temperature is equal to or less than a freezing point of water, and the electric motor includes motor brushes, commutator poles, a stator, a rotor rotatable with respect to the stator, and a shaft coupled to the rotor; locking the shaft of the electric motor such that the shaft is incapable of rotating, thereby fixing the shaft at a locked position; mounting the shaft of the electric motor to a dynamometer; supplying electrical energy to the electric motor; monitoring an instantaneous stall torque of the electric motor, via the dynamometer, while supplying the electrical energy to the electric motor and while maintaining the temperature of the electric motor at the predetermined temperature for a predetermined amount of time; monitoring a rotor electrical resistance while supplying the electrical energy to the electric motor and while maintaining the temperature of the electric motor at the predetermined temperature for the predetermined amount of time; unlocking the shaft of the electric motor; rotating the shaft of the electric motor in a rotational direction by a predetermined amount of mechanical degrees; and repeating locking the shaft, monitoring the instantaneous stall torque, monitoring rotor electrical resistance, unlocking the shaft, and rotating the shaft a predetermined number of times to determine a minimum torque required for breaking ice formed on the fuel cell cathode valve. The predetermined number of times is two full cycles of torque pulsation in rotating mechanical degrees.

Maintaining the temperature of the electric motor may include placing the electric motor inside a thermal chamber. The predetermined temperature may be minus thirty degrees Celsius. The predetermined amount of time may be one second. The predetermined amount of mechanical degrees may be one degree. Monitoring the instantaneous stall torque of the electric motor may include identifying a maximum stall torque during the predetermined amount of time.

Monitoring the instantaneous stall torque of the electric motor may include identifying a minimum stall torque during the predetermined amount of time. The method may further include calculating, via a data acquisition unit, a stall during the predetermined amount of time. Monitoring the rotor electrical resistance may include identifying a maximum rotor electrical resistance during the predetermined amount of time. Monitoring the rotor electrical resistance may include identifying a minimum rotor electrical resistance during the predetermined amount of time.

The method may further include calculating, via the data acquisition unit, an average rotor electrical resistance during the predetermined amount of time. The method may further include calculating, via the data acquisition unit, a difference between the maximum stall torque and the minimum stall torque. The method may further include calculating, via the data acquisition unit, the maximum rotor electrical resistance and the minimum rotor electrical resistance.

The method may further include computing, via the data acquisition unit, a minimum torque required for breaking ice formed on the fuel cell cathode valve as a function of the minimum stall torque and the maximum stall torque. The method may further include controlling the electric motor using the minimum torque required for breaking the ice formed on the fuel cell cathode valve to consistently break the ice formed on the fuel cell cathode valve.

The above features and advantages, and other features and advantages, of the present teachings are readily apparent from the following detailed description of some of the best modes and other embodiments for carrying out the present teachings, as defined in the appended claims, when taken in connection with the accompanying drawings.

DETAILED DESCRIPTION

The following detailed description is merely exemplary in nature and is not intended to limit the application and uses. Furthermore, there is no intention to be bound by expressed or implied theory presented in the preceding introduction, summary or the following detailed description.

Embodiments of the present disclosure may be described herein in terms of functional and/or logical block components and various processing steps. It should be appreciated that such block components may be realized by a number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with a number of systems, and that the systems described herein are merely exemplary embodiments of the present disclosure.

For the sake of brevity, techniques related to signal processing, data fusion, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that alternative or additional functional relationships or physical connections may be present in an embodiment of the present disclosure.

Figure 1:
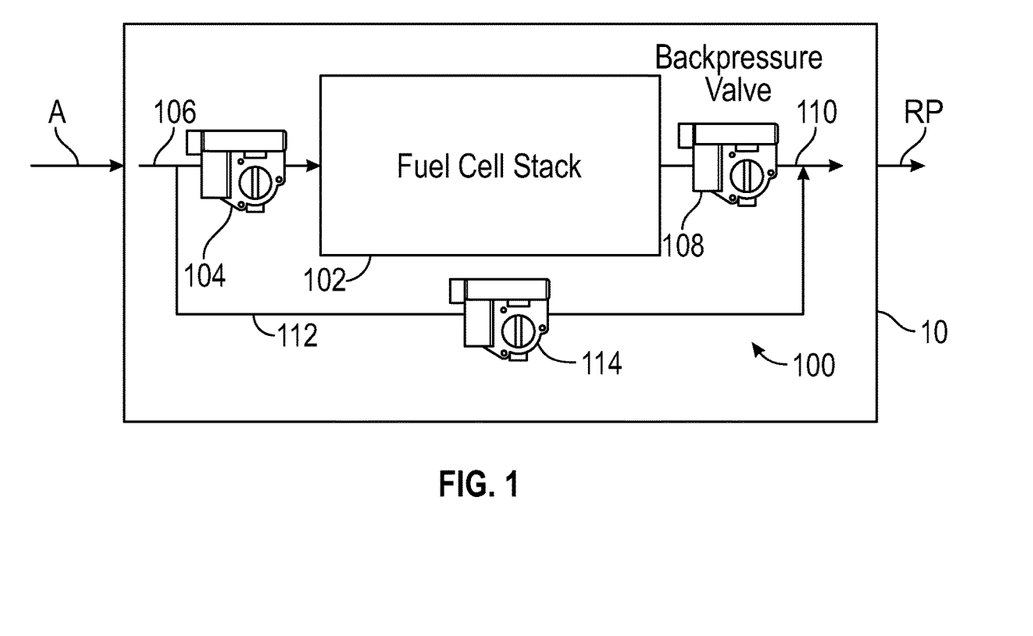
FIG. 1 is a schematic illustration of a vehicle including a fuel cell system.

With respect to FIG. 1, a vehicle 10 includes a fuel cell system 100 for propulsion. The fuel cell system 100 includes a fuel cell stack 102 including a plurality of fuel cells. The fuel cell stack 102 is configured to convert chemical energy of a fuel, such as hydrogen, and an oxidizing agent, such as oxygen, into electricity through a pair of redox reactions. In addition, to the fuel cell stack 102, the fuel cell system 100 includes an isolation valve 104 for controlling the fluid flow of air (which includes oxygen) into the fuel cell stack 102. The isolation valve 104 is directly coupled to an intake conduit to direct air A into the isolation valve 104. Aside from the isolation valve 104, the fuel cell system 100 includes a back-pressure valve 108 for controlling the fluid flow of the resulting products RP (including water) out of the fuel cell stack 102. The back-pressure valve 108 is directly coupled to an exhaust conduit 110. The fuel cell system 100 further includes a bypass conduit 112 that fluidly couples the exhaust conduit 110 and the intake conduit 106 to direct flow away from the fuel cell stack 102. A stack bypass valve 112 is disposed at the bypass conduit 112 to control the fluid flow from the intake conduit 106 to the exhaust conduit 110 through the bypass conduit 112. Each of the isolation valve 104, the back-pressure valve 108, and the stack bypass valve 112 may be identical to minimize costs.

Figure 2:
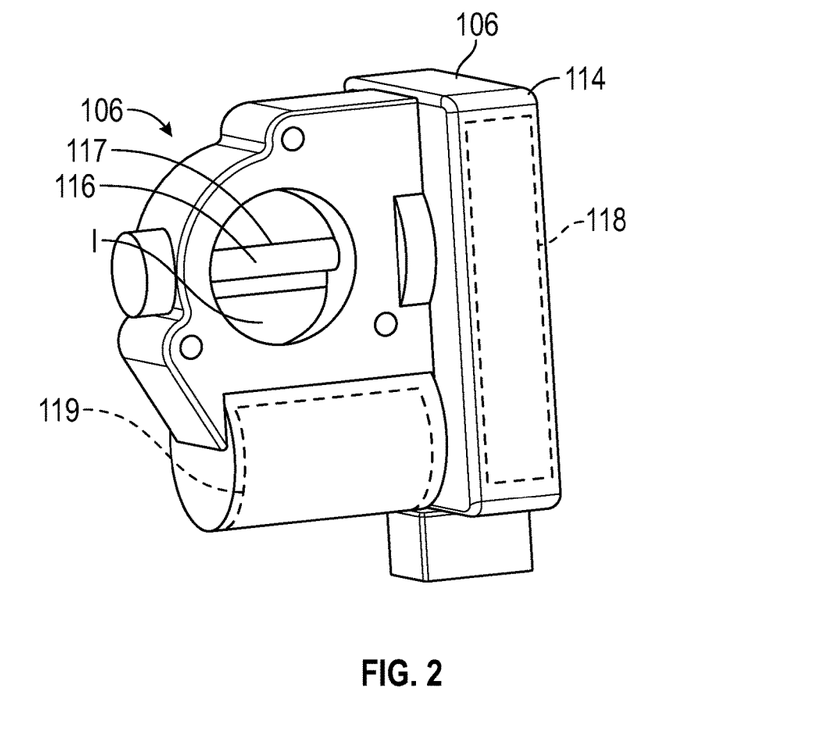
FIG. 2 is a schematic perspective view of a fuel cell cathode valve including a valve blade and an electric motor, wherein the fuel cell cathode valve is in a closed position and ice is formed on the valve blade.
Figure 3:
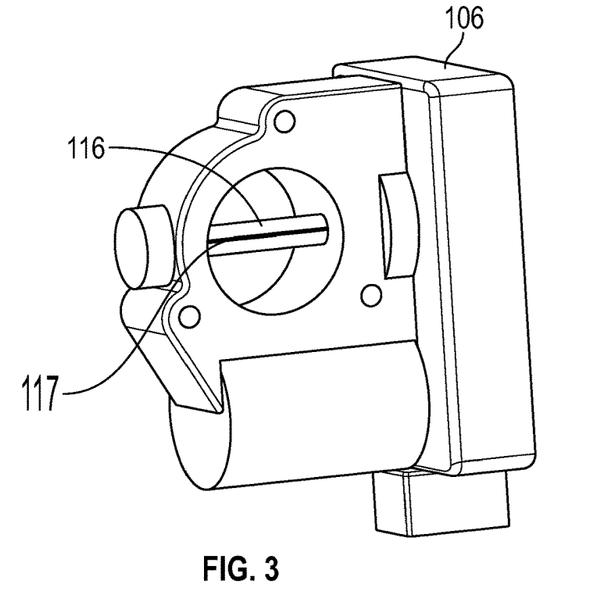
FIG. 3 is a schematic perspective view of the fuel cell cathode valve of FIG. 2, wherein the fuel cell cathode valve is in an open state.

With reference to FIGS. 2 and 3, for the sake of brevity, details of the isolation valve 104 are described below; however, it is contemplated that the details of the isolation valve 104 described herein also apply to the back-pressure valve 108 and the stack bypass valve 112. The isolation valve 104 has a closed state (FIG. 2) and an open state (FIG. 3). The isolation valve 104 includes a valve housing 114 and a rod 116 rotatably coupled to the valve housing 114. As a result, the rod 116 is rotatable with respect to the valve housing 114. The isolation valve 104 includes a valve blade 117 directly coupled to the rod 116. Therefore, rotating the rod 116 causes the valve blade 117 to move between a closed position (FIG. 2) and an open position (FIG. 3). The valve housing 114 houses an electric motor 119 and a gear assembly 118 connected to the electric motor 119. The gear assembly 118 is coupled between the electric motor 119 and the rod 116. Therefore, upon actuation of the electric motor 119, the gear assembly 118 causes the rod 116 to rotate with respect to the valve housing 114, thereby causing the valve blade 117 to move between the closed position (FIG. 2) and the open position (FIG. 3). Specifically, when the vehicle 10 is in the key-off state, the isolation valve 104 remains in the closed state and therefore the valve blade 117 remains in the closed position. When the vehicle 10 transitions from the key-off state to the key-on state, the isolation valve 104 transitions from the closed state (FIG. 2) to the open state (FIG. 3). However, if the ice I is formed on the valve blade 117, the isolation valve 104 may not move to the open position, thereby preventing the vehicle 10 from starting. To address this challenge, the present disclosure describes a method for identifying and mapping the torque required to break the ice I formed in the valve blade 117 and therefore move the valve blade 117 to the open position (FIG. 3), causing the vehicle 10 to start when the vehicle 10 transitions from the key-off state to the key-on state.

Figure 4:
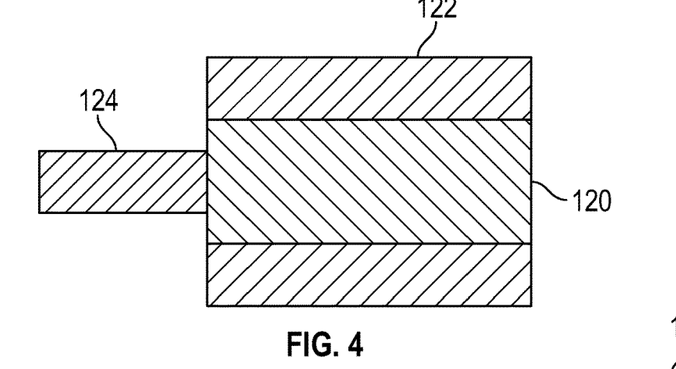
FIG. 4 is a schematic section side illustration of the electric motor of the fuel cell cathode valve of FIG. 2.
Figure 5:
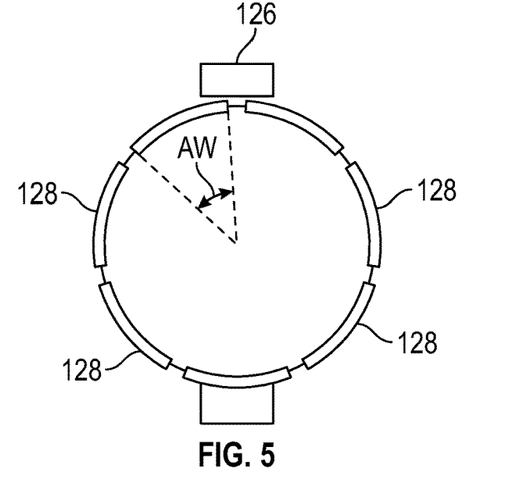
FIG. 5 is a schematic front section illustration of the electronic motor of the fuel cell cathode valve of FIG. 2.
Figure 6:
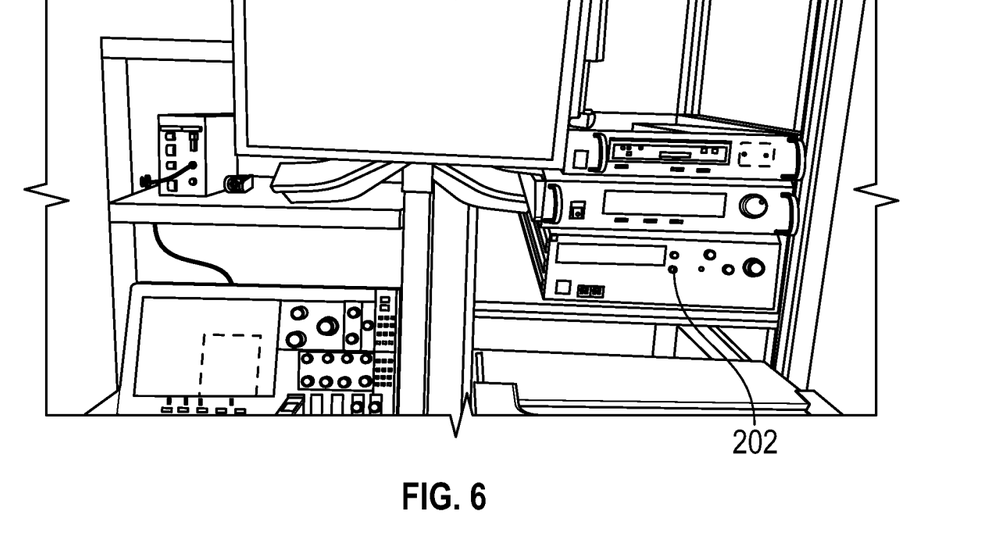
FIG. 6 is a schematic illustration of a data acquisition unit.
Figure 7:
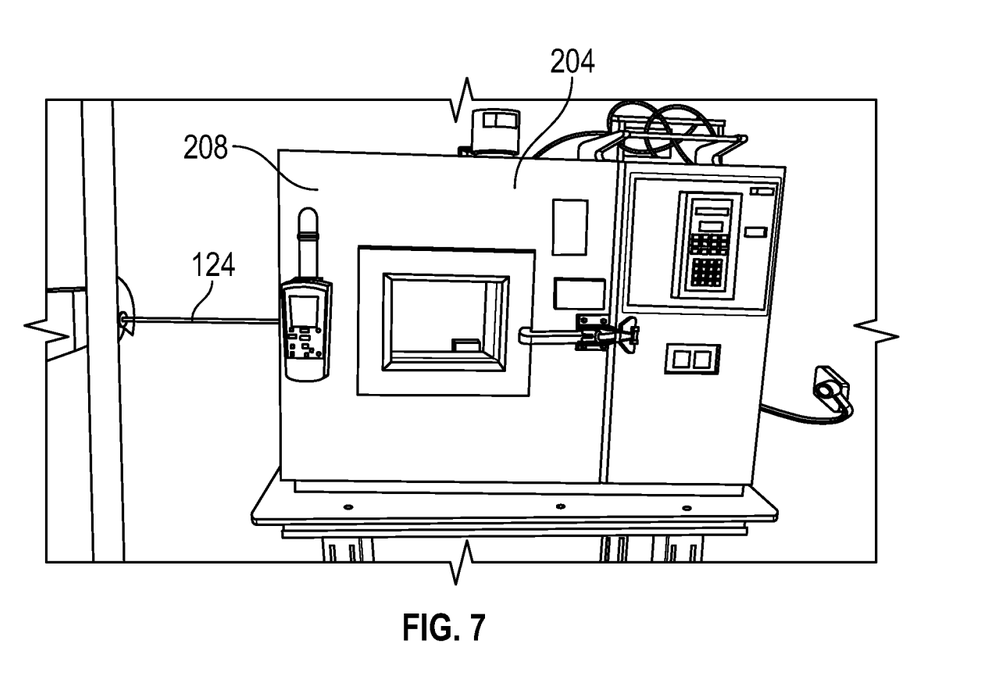
FIG. 7 is a schematic illustration of a thermal chamber.
Figure 8:
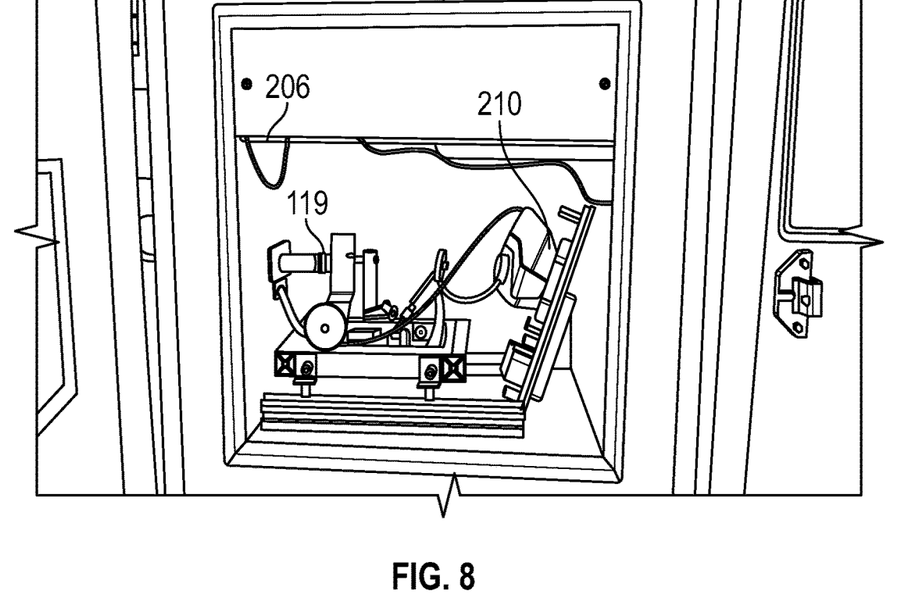
FIG. 8 is a schematic illustration of the thermal chamber of FIG. 7, with the door open and the electric motor of FIG. 2 disposed therein.
Figure 9:
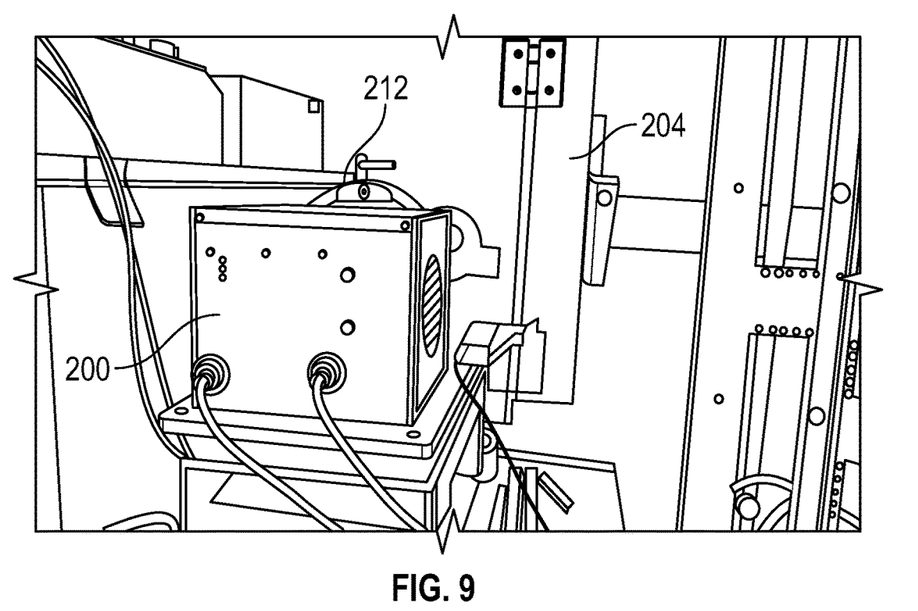
FIG. 9 is a schematic illustration of a dynamometer.
Figure 10:
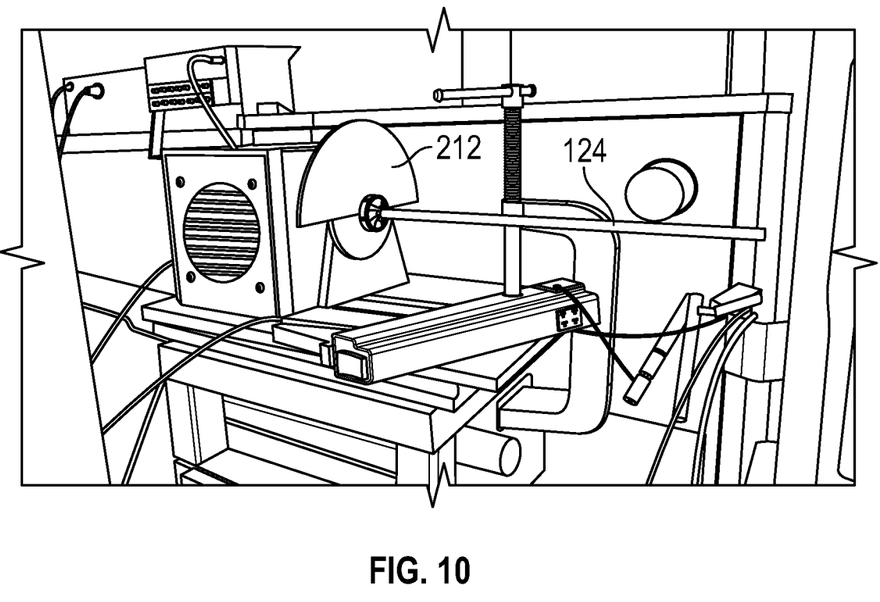
FIG. 10 is a schematic illustration of a shaft of the electric motor of FIG. 2 coupled to the dynamometer.
Figure 11:
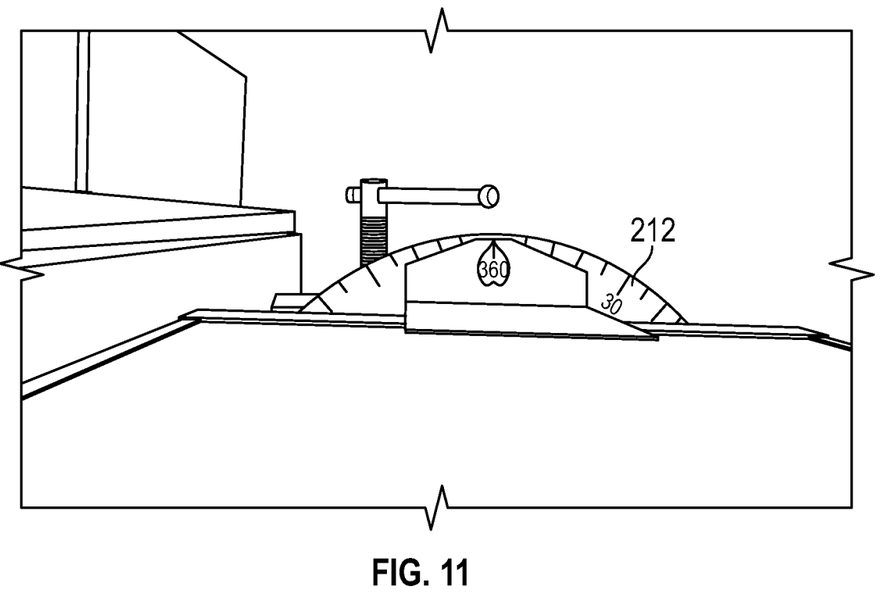
FIG. 11 is a schematic illustration of a semi-circular indexing fixture.

With respect to FIG. 4, the electric motor 119 includes a rotor 120, a stator 122 disposed around the rotor 120, and a shaft 124 directly connected to the rotor 120. Consequently, the shaft 124 rotates in unison with the rotor 120. The stator 122 remains stationary relative to the rotor 120 while the rotor 120 rotates. The electric motor 119 further includes a plurality of motor brushes 126 and a plurality of commutator poles 128. The electric motor 119 may have seven commutator poles 128 and two motor brushes 126. It is envisioned, however, that the electric motor 119 may have other quantity of motor brushes 126 and commutator poles 128. Each commutator pole 128 has an angular width AW. All the commutator poles 128 of the electric motor 119 have the same angular width AW. The angular width AW of each commutator pole 128 may be expressed as an angle (in mechanical degrees). The instantaneous stall torque may be different depending on the how many motor brushes 126 are in contact with commutator poles 128 This stall torque may be mapped to develop a control strategy to consistently break the ice I formed in the valve blade 117, thereby avoiding a no-start condition of the vehicle 10 when the vehicle 10 transitions from the key-off state to the key-on state.

FIGS. 5-11 illustrate the setup for testing the electric motor 119. A dynamometer 200 is coupled to the shaft 124 of the electric motor 119 to monitor and measure the instantaneous stall torque and the electrical resistance in the electric motor 119. A data acquisition unit 202 is coupled to the dynamometer 200 to collect the measurements of the dynamometer 200. The data acquisition unit 202 may include a processor, such as a microprocessor, and non-transitory storage medium. A thermal chamber 204 (which is also called a temperature chamber) is configured to maintain a predetermined temperature and defines an enclosure 206 sized to receive the electric motor 119. The thermal chamber 204 includes a door 208 to seal off the enclosure 206. A controller 210, such as engine control module (ECM), may also be disposed inside the thermal chamber. The controller 210 is electrically coupled to the electric motor 119 and functions, among other things, as a switch to control the supply of electrical energy to the electric motor 119.

The controller 210 includes at least one processor and a computer non-transitory readable storage device or media, such as the data acquisition unit 202. The processor can be a custom made or commercially available processor, a central processing unit (CPU), a graphics processing unit (GPU), an auxiliary processor among several processors associated with the controller 210, a semiconductor-based microprocessor (in the form of a microchip or chip set), a macroprocessor, a combination thereof, or generally a device for executing instructions. The computer readable storage device or media may include volatile and nonvolatile storage in read-only memory (ROM), random-access memory (RAM), and keep-alive memory (KAM), for example. KAM is a persistent or non-volatile memory that may be used to store various operating variables while the processor is powered down. The computer-readable storage device or media may be implemented using a number of memory devices such as PROMs (programmable read-only memory), EPROMs (electrically PROM), EEPROMs (electrically erasable PROM), flash memory, or another electric, magnetic, optical, or combination memory devices capable of storing data, some of which represent executable instructions, used by the controller 210 in controlling the electric motor 119.

With continued reference to FIGS. 5-10, the shaft 124 of the electric motor 119 extends outside the thermal chamber 204 and is mounted to the dynamometer 200. A semi-circular indexing fixture 212 is mounted on the shaft 124 and is disposed outside the dynamometer 200. In operation, the semi-circular indexing fixture 212 rotates in unison with the shaft 124 and is therefore configured to determine the rotational position of the shaft 124 in, for example, mechanical degrees.

Figure 12:
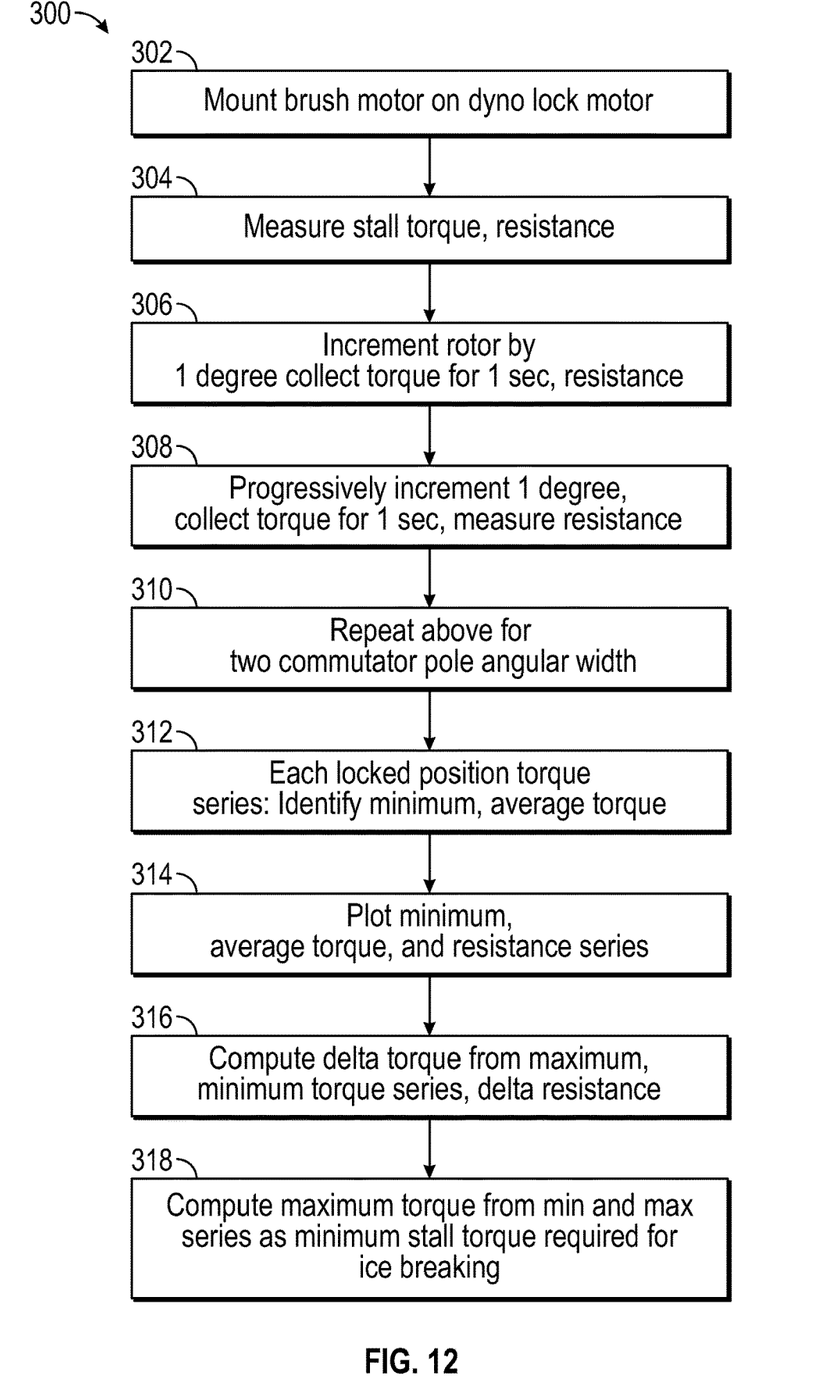
FIG. 12 is a flowchart of a method for identifying and mapping of fuel cell fuel cell cathode valve ice breaking stall toque capability.

FIG. 12 is a flowchart of a method 300 for identifying and mapping of fuel cell fuel cell cathode valve ice breaking stall toque capability. The controller 210 and/or the data acquisition unit 202 may be specifically programmed to execute the instructions set forth in the method 300. While performing the method 300, the gear assembly 118 is decoupled from the electric motor 119. The method 300 begins at block 302. Block 302 mounting the shaft 124 of the electric motor 119 on the dynamometer 200. In block 302, the semi-circular indexing fixture 212 is rotatably coupled to the shaft 124 of the electric motor 119. Consequently, the semi-circular indexing fixture 212 is capable of measuring the mechanical degrees of the shaft 124 of the electric motor 119 (see FIGS. 10 and 11). Block 302 also entails locking the shaft 124 and the rotor 120 of the electric motor 119 to prevent the shaft 124 and the rotor 120 from rotating relative to the stator 122. To do so, a dynamometer 200 may be used to lock the shaft 124 and the rotor 120. After locking the rotor 120 and the shaft 124, the shaft 124 and the rotor 120 are incapable of rotating relative to the stator 122. Block 302 also entails placing the electric motor 119 inside the thermal chamber 204 to maintain the temperature of the electric motor 119 at a predetermined set temperature (e.g., minus thirty degrees Celsius). This predetermined set temperature may be the freezing point of water to identify and map the instantaneous stall torque of the isolation valve 104 when ice I is formed on the valve blade 117. For example, at block 302, the electric motor 119 may be placed inside the thermal chamber 204 to maintain the electric motor 119 at a temperature of minus thirty degrees Celsius to identify and map the instantaneous stall torque of the isolation valve 104 (i.e., fuel cell cathode valve) when ice I is formed on the valve blade 117. In other words, the predetermined set temperature may be minus thirty degrees Celsius to mimic the condition in which ice I is formed on the valve blade 117 of the isolation valve 104.

After block 302, the method 300 proceeds to block 304. At block 304, electrical energy is supplied to the electric motor 119. Further, at block 304, the dynamometer 200 is used to measure the instantaneous stall torque for a predetermined amount of time (e.g., one second) while electrical energy is supplied to the electric motor 119 at a predetermined voltage (e.g., 15 volts or 13.5 volts). At block 304, an ohmmeter (which may be part of the dynamometer 200) is used to measure the resistance of the rotor 120 between the input terminal and the output terminal of the rotor 120 (i.e., the rotor electrical resistance) for the same predetermined amount of time. This predetermined amount of time may be one second in order to obtain a comprehensive general view of the behavior of the shaft 124 while the electric motor 119 is maintained at the predetermined set temperature and at the predetermined mechanical degree of the rotor. During this predetermined amount of time, the data acquisition unit 202 collects the maximum stall toque, the minimum stall torque, and the average stall torque while electrical energy is supplied to the electric motor 119 at the predetermined voltage. Similarly, the data acquisition unit 202 collects the maximum rotor electrical resistance, the minimum rotor electrical resistance, and the average rotor electrical resistance during the predetermined amount of time while electrical energy is supplied to the electric motor 119 at the predetermined voltage. Then, the method 300 proceeds to block 306.

At block 306, the shaft 124 and the rotor 120 of the electric motor 119 are unlocked. To do so, the dynamometer 200 may be decoupled from the shaft 124. The shaft 124 is then rotated a predetermined amount of mechanical degrees (e.g., one degree) as measured by the semi-circular indexing fixture 212. As a consequence, the rotor 120 is rotated by the predetermined amount of mechanical degrees. The predetermined amount of mechanical degrees may be one degree in order to prevent short circuits. After rotating the shaft 124 by the predetermined amount of mechanical degrees, the shaft 124 and the rotor 120 of the electric motor 119 are locked in position, thereby preventing the shaft 124 and the rotor 120 from rotating relative to the stator 122. To do so, the dynamometer 200 may be used to lock the shaft 124, thereby preventing the shaft 124 and the rotor 120 from rotating relative to the stator 122. After locking the shaft 124 and the rotor 120, the dynamometer 200 is used to measure the instantaneous stall torque for the predetermined amount of time (e.g., one second) while electrical energy is supplied to the electric motor 119 at a predetermined voltage (e.g., 15 volts or 13.5 volts). At block 306, an ohmmeter (which may be part of the dynamometer 200) is used to measure the resistance of the rotor 120 between the input terminal and the output terminal of the rotor 120 (i.e., the rotor electrical resistance) for the same predetermined amount of time. This predetermined amount of time may be one second in order to obtain a comprehensive general view of the behavior of the shaft 124 while the electric motor 119 is maintained at the predetermined set temperature and at the predetermined mechanical degree of the rotor. During this predetermined amount of time, the data acquisition unit 202 collects the maximum stall toque, the minimum stall torque, and the average stall torque while electrical energy is supplied to the electric motor 119 at the predetermined voltage. Similarly, the data acquisition unit 202 collects the maximum rotor electrical resistance, the minimum rotor electrical resistance, and the average rotor electrical resistance during the predetermined amount of time while electrical energy is supplied to the electric motor 119 at the predetermined voltage. Then, the method 300 proceeds to block 308.

At block 308, the rotor 120 is progressive incremented (i.e., rotated) by the predetermined amount of mechanical degrees (e.g., one degree) as measured by the semi-circular indexing fixture 212. As a consequence, the rotor 120 is rotated by the predetermined amount of mechanical degrees. The predetermined amount of mechanical degrees may be one degree in order to prevent short circuits. After rotating the shaft 124 by the predetermined amount of mechanical degrees, the shaft 124 and the rotor 120 of the electric motor 119 are locked in position, thereby preventing the shaft 124 and the rotor 120 from rotating relative to the stator 122. To do so, the dynamometer 200 may be used to lock the shaft 124, thereby preventing the shaft 124 and the rotor 120 from rotating relative to the stator 122. After locking the shaft 124 and the rotor 120, the dynamometer 200 measures the instantaneous stall torque for the predetermined amount of time (e.g., one second) while electrical energy is supplied to the electric motor 119 at a predetermined voltage (e.g., 15 volts or 13.5 volts). At block 308, an ohmmeter (which may be part of the dynamometer 200) is used to measure the resistance of the rotor 120 between the input terminal and the output terminal of the rotor 120 (i.e., the rotor electrical resistance) for the same predetermined amount of time. This predetermined amount of time may be one second in order to obtain a comprehensive general view of the behavior of the shaft 124 while the electric motor 119 is maintained at the predetermined set temperature and at the predetermined mechanical degree of the rotor. During this predetermined amount of time, the data acquisition unit 202 collects the maximum stall toque, the minimum stall torque, and the average stall torque while electrical energy is supplied to the electric motor 119 at the predetermined voltage. Similarly, the data acquisition unit 202 collects the maximum rotor electrical resistance, the minimum rotor electrical resistance, and the average rotor electrical resistance during the predetermined amount of time while electrical energy is supplied to the electric motor 119 at the predetermined voltage. Then, the method 300 proceeds to block 310.

At block 310, the actions described in block 308 are repeated a predetermined number of times. The predetermined number of times is two full cycles of torque pulsation in rotating mechanical degrees. Specifically, the actions described in block 308 are repeated for a predetermined-total amount of mechanical degrees that is equal to the sum of the angular widths of two commentator poles 128 in order to obtain a comprehensive view of the behavior of the electric motor 119. In other words, the instantaneous stall torque and rotor electrical resistance measurements are taken incrementally at each predetermined amount of mechanical degree (one mechanical degree) for the predetermined amount of times until the rotor is rotated by the predetermined-total amount of mechanical degrees. The term "two full cycles of torque pulsation in rotating mechanical degrees" means a predetermined-total amount of mechanical degrees that is equal to the sum of the angular widths of two commentator poles 128. Next, method 300 proceeds to block 312.

Figure 13:
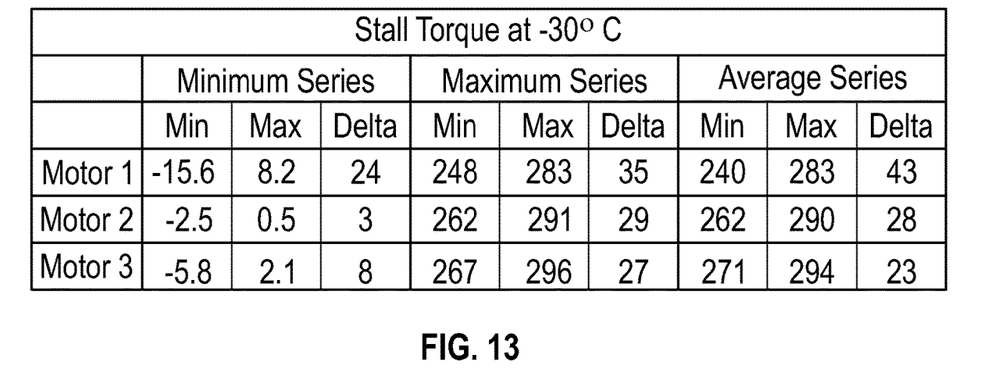
FIG. 13 is an example of a table of the torque series.
Figure 14:
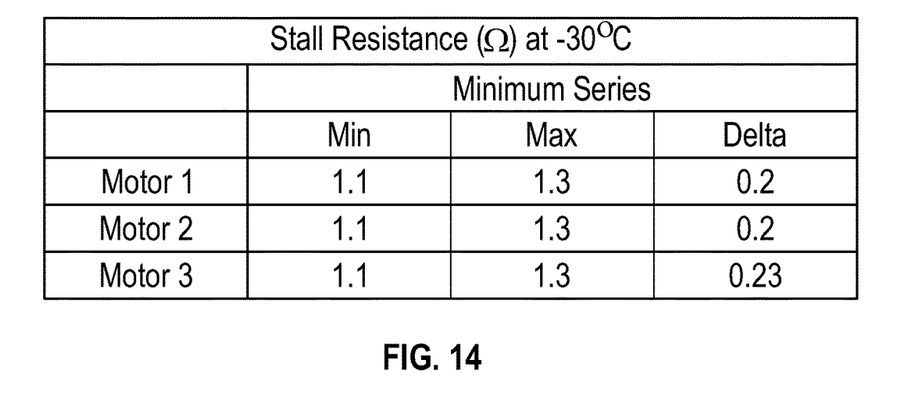
FIG. 14 is an example of a table of the rotor electrical resistance series.

At block 312, the data acquisition unit 202 identifies the maximum stall torque and the average torque at each locked position of the shaft 124. More than one electric motor 119 may be tested. Accordingly, a table may be created to identify the maximum stall torque, the minimum stall torque, and the average stall torque. The table illustrates the maximum stall torque series, the minimum stall torque series, and average stall torque series. FIG. 13 shows an example of a table with the maximum stall torque series, the minimum stall torque series, and the average stall torque series. Also, the data acquisition unit 202 identifies the maximum rotor electrical resistance, the minimum rotor electrical resistance, and the average rotor electrical resistance at each locked rotor position. FIG. 14 is an example of a table including the minimum rotor electrical resistance, the maximum rotor electrical resistance series as tested in three electric motors 119. Next, the method 300 proceeds to block 314.

At block 314, the data acquisition unit 202 plots the maximum torque series, minimum torque series, the average torque series, and rotor electrical resistance series in a graph. Then, the method 300 proceeds to block 316.

At block 316, the data acquisition unit 202 calculates the difference (i.e., delta) between the minimum stall torque and the maximum stall torque for each electric motor 119 that was tested as shown in FIG. 13. Also, at block 316, the controller 210 calculates the difference (i.e., delta) between the maximum rotor electrical resistance and the minimum rotor electrical resistance for each of the electric motor 119 that was tested. Next, the method 300 proceeds to block 318.

Figure 15:
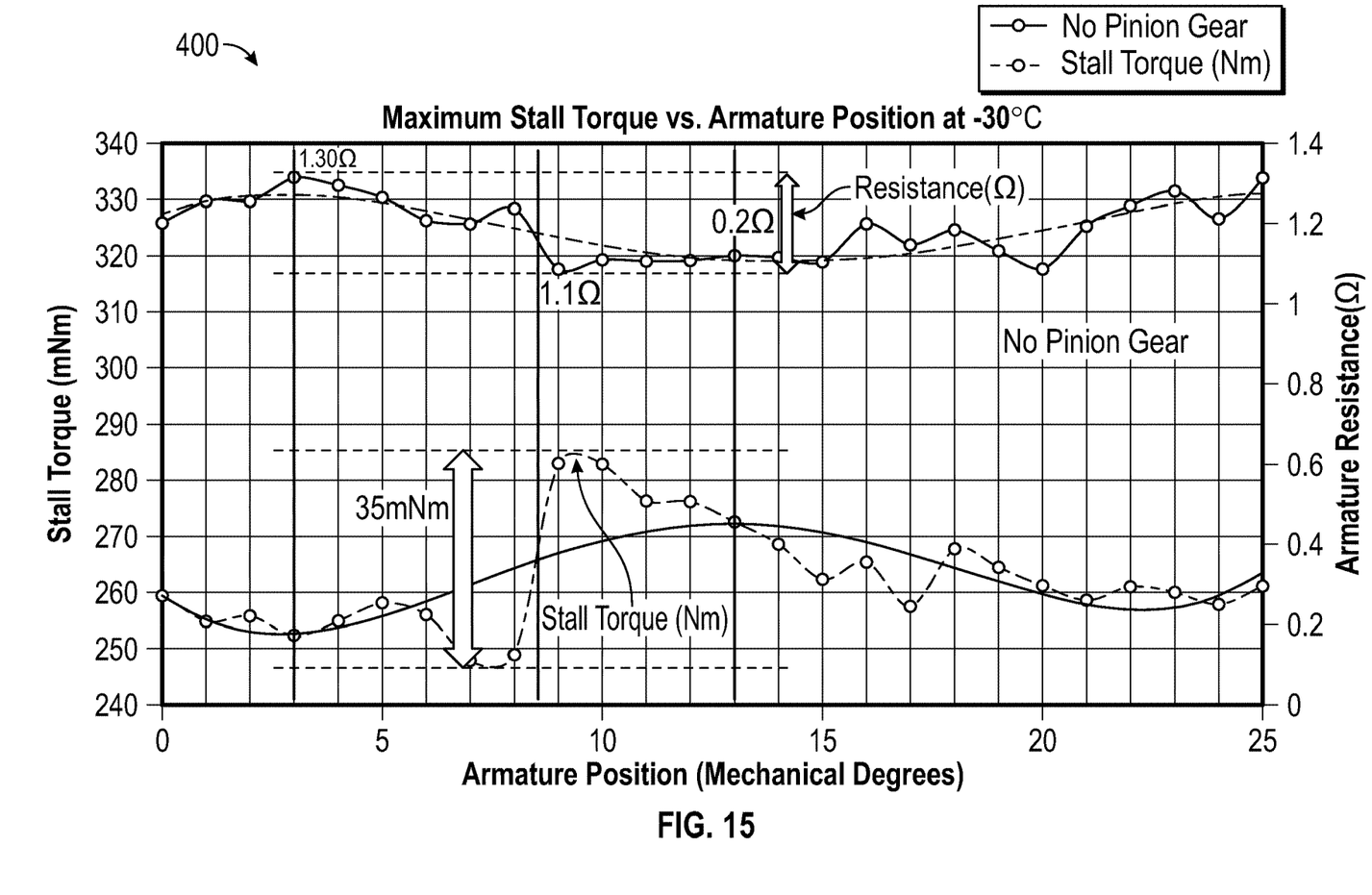
FIG. 15 is an example of a graph, showing the relationship between the instantaneous stall torque and resistance relationship waveforms.

At block 318, the data acquisition unit 202 computes a minimum torque required for breaking the ice I formed on the blade 117 as a function of the minimum stall torque and the maximum stall torque series. Then, the electric motor 119 is controlled using the minimum torque required for breaking the ice I formed on the valve blade 117. In other words, the controller 210 is programmed to control the electric motor 119 to consistently break the ice I formed on the valve blade 117, thereby avoiding a non-start condition of the vehicle 10 after the vehicle 10 transitions from the key-off state to the key-on state. By performing the method 300, the graph 400 may be obtained. The graph 400 shows the instantaneous stall torque and resistance relationship waveforms.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

What is claimed is:

1. A method for identifying and mapping a maximum instantaneous stall torque capability of a fuel cell cathode valve, comprising:

maintaining a temperature of an electric motor at a predetermined temperature, wherein the predetermined temperature is equal to or less than a freezing point of water, and the electric motor includes motor brushes, commutator poles, a stator, a rotor rotatable with respect to the stator, and a shaft coupled to the rotor;

locking the shaft of the electric motor such that the shaft is incapable of rotating, thereby fixing the shaft at a locked position;

mounting the shaft of the electric motor to a dynamometer;

supplying electrical energy to the electric motor;

monitoring an instantaneous stall torque of the electric motor, via the dynamometer, while supplying the electrical energy to the electric motor and while maintaining the temperature of the electric motor at the predetermined temperature for a predetermined amount of time;

monitoring a rotor electrical resistance while supplying the electrical energy to the electric motor and while maintaining the temperature of the electric motor at the predetermined temperature for the predetermined amount of time;

unlocking the shaft of the electric motor;

rotating the shaft of the electric motor in a rotational direction by a predetermined amount of mechanical degrees; and repeating locking the shaft, monitoring the instantaneous stall torque, monitoring rotor electrical resistance, unlocking the shaft, and rotating the shaft a predetermined number of times to determine a minimum torque required for breaking ice formed on the fuel cell cathode valve, wherein the predetermined number of times is two full cycles of torque pulsation in rotating mechanical degrees.

2. The method of claim 1, wherein maintaining the temperature of the electric motor at the predetermined temperature includes placing the electric motor inside a thermal chamber.

3. The method of claim 2, wherein the predetermined temperature is minus thirty degrees Celsius.

4. The method of claim 3, wherein the predetermined amount of time is one second.

5. The method of claim 4, wherein the predetermined amount of mechanical degrees is one degree.

6. The method of claim 5, wherein monitoring, via a data acquisition unit, the instantaneous stall torque of the electric motor includes identifying a maximum stall torque during the predetermined amount of time.

7. The method of claim 6, wherein monitoring, via the data acquisition unit, the instantaneous stall torque of the electric motor includes identifying a minimum stall torque during the predetermined amount of time.

8. The method of claim 7, further comprising calculating, via the data acquisition unit, an average stall during the predetermined amount of time.

9. The method of claim 8, wherein monitoring the rotor electrical resistance includes identifying a maximum rotor electrical resistance during the predetermined amount of time.

10. The method of claim 9, wherein monitoring the rotor electrical resistance includes identifying a minimum rotor electrical resistance during the predetermined amount of time.

11. The method of claim 10, further comprising calculating, via the data acquisition unit, an average rotor electrical resistance during the predetermined amount of time.

12. The method of claim 11, further comprising calculating, via the data acquisition unit, a difference between the maximum stall torque and the minimum stall torque.

13. The method of claim 12, further comprising calculating, via the controller, the maximum rotor electrical resistance and the minimum rotor electrical resistance.

14. The method of claim 13, further comprising computing, via the controller, a minimum torque required for breaking ice formed on the fuel cell cathode valve as a function of the minimum stall torque and the maximum stall torque.

15. The method of claim 14, further comprising controlling the electric motor using the minimum torque required for breaking the ice formed on the fuel cell cathode valve to consistently breaking the ice formed on the fuel cell cathode valve.

16. A method for identifying and mapping a maximum instantaneous stall torque capability of a fuel cell cathode valve, comprising:

maintaining a temperature of an electric motor at a predetermined temperature, wherein maintaining the temperature of an electric motor at a predetermined temperature includes placing the electric motor inside a thermal chamber, and the electric motor includes motor brushes, commutator poles, a stator, a rotor rotatable with respect to the stator, and a shaft coupled to the rotor, and the predetermined temperature is minus thirty degrees Celsius;

locking the shaft of the electric motor such that the shaft is incapable of rotating, thereby fixing the shaft at a locked position;

mounting the shaft of the electric motor to a dynamometer;

supplying electrical energy to the electric motor;

monitoring an instantaneous stall torque of the electric motor, via the dynamometer, while supplying the electrical energy to the electric motor and while maintaining the temperature of the electric motor at the predetermined temperature for a predetermined amount of time;

monitoring a rotor electrical resistance while supplying the electrical energy to the electric motor and while maintaining the temperature of the electric motor at the predetermined temperature for the predetermined amount of time;

unlocking the shaft of the electric motor;

rotating the shaft of the electric motor in a rotational direction by a predetermined amount of mechanical degrees; and repeating the locking the shaft, the monitoring the instantaneous stall torque, the monitoring rotor electrical resistance, the unlocking the shaft, and the rotating the shaft a predetermined number of times to determine a minimum torque required for breaking ice formed on the fuel cell cathode valve, wherein the predetermined number of times is two full cycles of torque pulsation in rotating mechanical degrees.

17. The method of claim 16, wherein the predetermined amount of time is one second, the predetermined amount of mechanical degrees is one degree, monitoring, via a data acquisition unit, the instantaneous stall torque of the electric motor includes identifying a maximum stall torque during the predetermined amount of time, monitoring, via the data acquisition unit, the instantaneous stall torque of the electric motor includes identifying a minimum stall torque during the predetermined amount of time.

18. The method of claim 17, further comprising calculating, via the data acquisition unit, an average stall during the predetermined amount of time, wherein monitoring the rotor electrical resistance includes identifying a maximum rotor electrical resistance during the predetermined amount of time, monitoring the rotor electrical resistance includes identifying a minimum rotor electrical resistance during the predetermined amount of time.

19. The method of claim 18, further comprising:

calculating, via the data acquisition unit, an average rotor electrical resistance during the predetermined amount of time;

calculating, via the controller, a difference between the maximum stall torque and the minimum stall torque;

calculating, via the data acquisition unit, the maximum rotor electrical resistance and the minimum rotor electrical resistance;

computing, via the data acquisition unit, a minimum torque required for breaking ice formed on the fuel cell cathode valve as a function of the minimum stall torque and the maximum stall torque; and controlling the electric motor using the minimum torque required for breaking the ice formed on the fuel cell cathode valve to consistently break the ice formed on the fuel cell cathode valve.

* * * * *